(12) United States Patent
Morita

(10) Patent No.: US 8,466,821 B2
(45) Date of Patent: Jun. 18, 2013

(54) DELTA SIGMA ADC

(75) Inventor: Tadashi Morita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 13/256,524

(22) PCT Filed: Jan. 7, 2011

(86) PCT No.: PCT/JP2011/000045
§ 371 (c)(1),
(2), (4) Date: Sep. 14, 2011

(87) PCT Pub. No.: WO2011/089859
PCT Pub. Date: Jul. 28, 2011

(65) Prior Publication Data
US 2012/0001782 A1    Jan. 5, 2012

(30) Foreign Application Priority Data

Jan. 20, 2010   (JP) .................................. 2010-010109

(51) Int. Cl.
*H03M 3/00*   (2006.01)
(52) U.S. Cl.
USPC ......................................... 341/143; 341/155
(58) Field of Classification Search
USPC ......................................... 341/143, 122, 155
See application file for complete search history.

(56) References Cited

U.S. PATENT DOCUMENTS

| 5,745,060 | A | * | 4/1998 | McCartney et al. | .......... 341/120 |
| 5,949,360 | A | | 9/1999 | Maejima | |
| 6,340,945 | B1 | * | 1/2002 | Hauptmann et al. | .......... 341/172 |
| 7,355,539 | B2 | * | 4/2008 | Petersen et al. | .............. 341/143 |
| 7,796,069 | B2 | * | 9/2010 | Li | ................................. 341/122 |
| 2007/0247340 | A1 | | 10/2007 | Tada | |
| 2009/0195423 | A1 | | 8/2009 | Li | |

FOREIGN PATENT DOCUMENTS

| EP | 2088677 | 8/2009 |
| JP | 07-249989 | 9/1995 |
| JP | 9-74355 | 3/1997 |
| JP | 2003-234638 | 8/2003 |
| JP | 2007-295197 | 11/2007 |
| JP | 2008-28855 | 2/2008 |

OTHER PUBLICATIONS

International Search Report, dated Feb. 15, 2011, for corresponding International Application PCT/JP2011/000045.

* cited by examiner

*Primary Examiner* — Brian Young
(74) *Attorney, Agent, or Firm* — Greenblum & Bernstein, P.L.C.

(57) ABSTRACT

A ΔΣADC is provided that is capable of suppressing increase of a circuit scale without losing noise shaping function even when a switching speed of a switch for performing time-division process is lower than a sampling rate of the ΔΣADC. For a code values provided by a comparator (105), the ΔΣADC (100) has a first storage section (106-1) and a second storage section (106-2) respectively for signal sequences (a first signal sequence and a second signal sequence) constituting a time-divisionally combined signal. Then, one of the two storage sections (i.e. the first storage section (106-1) and the second storage section (106-2)) that corresponds to a branch selection signal is configured to store the code value obtained from the comparator (105). On the other hand, one of the two storage sections (i.e. the first storage section (106-1) and the second storage section (106-2)) that is not the storage section corresponding to the branch selection signal is configured to hold the already stored code value.

8 Claims, 5 Drawing Sheets

DELTA SIGMA ADC

TECHNICAL FIELD

The present invention relates to a ΔΣADC (Analog to Digital Converter) capable of performing ΔΣAD (Delta Sigma Analog to Digital) conversion on a time-divisionally combined signal sequence.

BACKGROUND ART

In recent years, communication systems are required to achieve extremely wide band and fast speed. Therefore, a sampling rate of used in a ΔΣADC is extremely fast, exceeding several hundred MHz. The ΔΣADC uses ΔΣ modulation for converting an analog signal into a one-bit digital signal, thus capable of suppressing quantization error near DC by noise shaping.

When a generally-available quantizer is used to perform quantization, a quantization noise is distributed over all frequencies. In contrast, when a ΔΣ modulator is used to perform quantization, a quantization noise is suppressed near DC, and a quantization noise is formed in high frequency. Such characteristic of the ΔΣ modulator is called noise shaping characteristic.

By the way, in recent years, systems requiring a plurality of high frequency sections are expected, such as MIMO (Multiple Input Multiple Output), MRC (Maximum Ratio Combining), and diversity. In such system, reduction in the size of the circuit is requested. More specifically, in order to reduce the circuit scale, MIMO, MRC, or diversity is requested to time-divisionally use high frequency sections to share the circuit.

Patent literature 1 and patent literature 2 disclose time-division ΔΣADCs. The time-division ΔΣADCs disclosed in patent literature 1 and patent literature 2 perform time-division process for each one of sample times to switch to another sequence. Therefore, the speed of target time-division relies on the sample time. More specifically, in a system in which two sequences of signals including the first sequence and the second sequence are time-divisionally combined, the time-division ΔΣADC alternately selects signals from different sequence, e.g., first choosing a sample from the first sequence, then choosing a sample from the second sequence, and then choosing a sample from the first sequence. Then, the time-division ΔΣADC handles the signal sequence in which these signals are arranged. In this case, it is necessary for the time-division ΔΣADC to time-divisionally combine the plurality of signal sequences using a switch.

When an external component is used as the switch, there is a limitation in the switching speed. On the other hand, the sampling rate of the ΔΣADC is extremely fast, exceeding several hundred MHz. Therefore, there is a limitation in the switching speed of the switch, and when the switching speed of the switch is about 100 MHz, it is necessary to reduce the actual sampling rate of the ΔΣADC to about 100 MHz when a conventional technique is simply used.

CITATION LIST

Patent Literature

PTL 1
Japanese Patent Application Laid-Open No. HEI 7-249989
PTL 2
Japanese Patent Application Laid-Open No. 2007-295197

SUMMARY OF INVENTION

Technical Problem

However, the above time-division ΔΣADC has a problem in that it is difficult to operate the ΔΣADC at a low sampling rate. Further, when fast time-division operation is performed in the above time-division ΔΣADC, it is necessary to accurately control the switch provided at a stage prior to the ΔΣADC and to incorporate non-overlap processing in the switching control. In such case, there is a problem in that it becomes more difficult to achieve the time-division ΔΣADC, and the circuit scale of the time-division ΔΣADC increases.

On the other hand, the noise shaping characteristic is characterized in that a higher sampling rate results in a higher suppression effect of a quantization noise near DC. Therefore, there is a problem in that when the switching speed of the switch for performing the time-division process is low, and actual sampling rate is low, the noise shaping characteristic deteriorates.

It is therefore an object of the present invention to provide a ΔΣADC capable of suppressing increase of a circuit scale without losing noise shaping function even when a switching speed of a switch for performing time-division process is lower than a sampling rate of the ΔΣADC.

Solution to Problem

A ΔΣADC according to the present invention is a ΔΣADC for performing ΔΣADC conversion at a first rate, wherein the ΔΣADC includes an operational amplifier that integrates a feedback signal and a time-divisionally combined signal that is obtained by time-divisionally combining M signal sequences (M is an integer of 2 or more) at a second rate which is lower than the first rate, the M integral capacities, a switch that controls selection of an integral capacity for use, from among the M integral capacities, a comparing section that encodes and converts, into a code value, an integration result provided by an integration processing section formed by the operational amplifier and the integral capacity selected by the switch, a storage section that stores respective code value for the M signal sequences, a selection section that selects one of the M code values stored for the M signal sequences, and a DAC that converts, from digital to analog, the selected code value and generates the feedback signal.

Advantageous Effects of Invention

The present invention can suppress increase of a circuit scale without losing noise shaping function even when a switching speed of a switch for performing time-division process is lower than a sampling rate of the ΔΣADC.

DESCRIPTION OF EMBODIMENTS

Embodiments of the present invention will be hereinafter explained in detail with reference to drawings.

(Embodiment 1)

Figure 1:
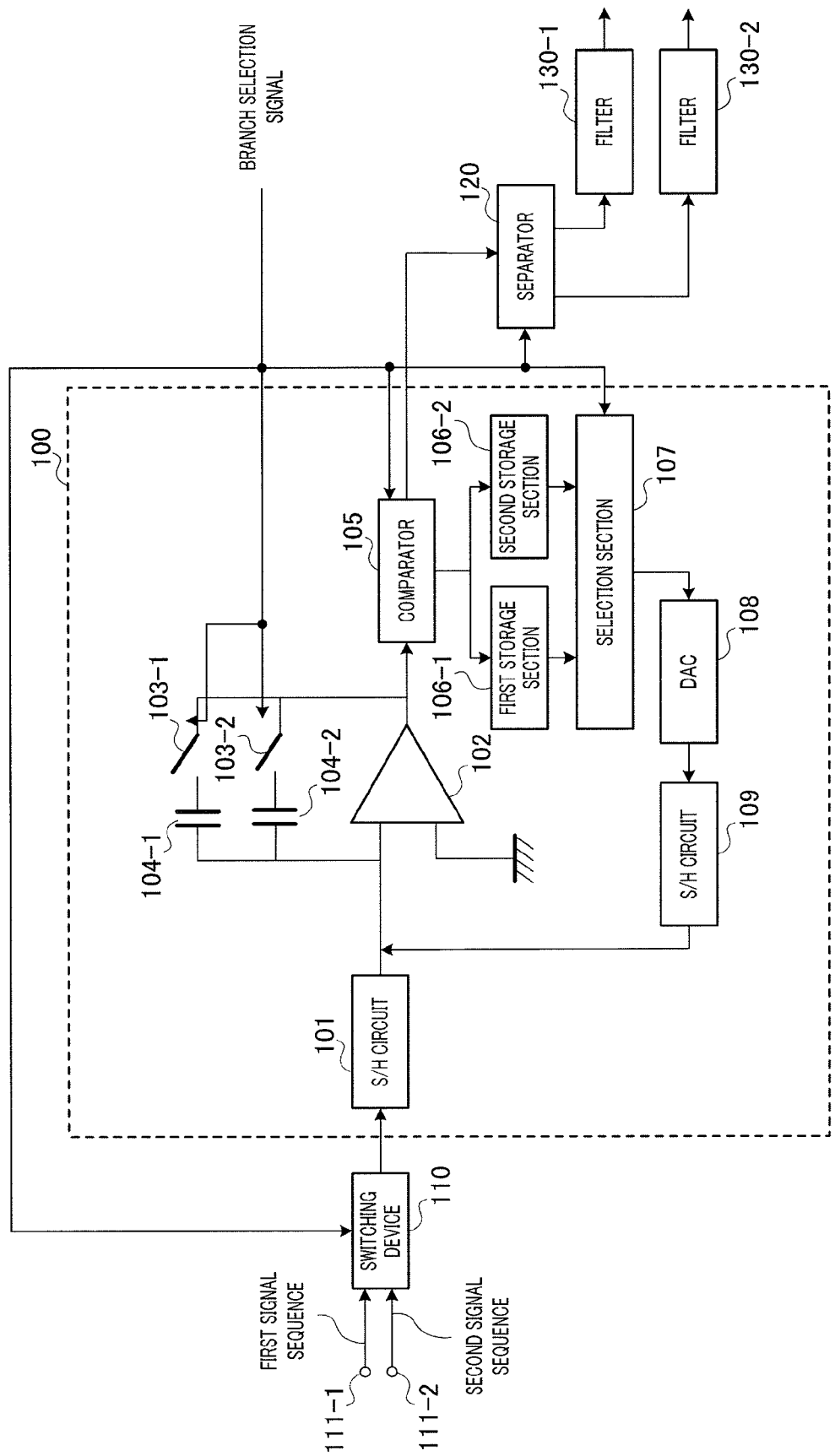
FIG. 1 is a block diagram illustrating an essential configuration of a ΔΣADC according to Embodiment 1 of the present invention.

FIG. 1 is a block diagram illustrating an essential configuration of a ΔΣADC according to Embodiment 1 of the present invention. ΔΣADC 100 as shown in FIG. 1 is a discrete time time-division ΔΣADC. It should be noted that ΔΣADC 100 as shown in FIG. 1 time-divisionally combines two sequences into one sequence, which shows a configuration where the number of branches is two. It should be noted that the number of branches is not limited to two. The present invention can also be applied to a case where the number of branches is three or more in which a plurality of sequences (i.e. three or more sequences) are time-divisionally combined into one sequence. In the explanation below, a system for time-divisionally combining two sequences into one sequence will be explained using an example where the number of branches is two.

ΔΣADC 100 includes sample hold (S/H) circuit 101, operational amplifier 102, switch 103-1, switch 103-2, capacity (integral capacity) 104-1, capacity (integral capacity) 104-2, comparator 105, first storage section 106-1, second storage section 106-2, selection section 107, DAC (Digital to Analog Converter) 108, and S/H circuit (sample hold circuit) 109.

In FIG. 1, switching device 110 is provided at a stage previous to ΔΣADC 100. Separator 120 and filters 130-1 and 130-2 are provided at a stage subsequent to ΔΣADC 100.

Switching device 110 time-divides a first signal sequence input from first input terminal 111-1 and a second signal sequence input from second input terminal 111-2, and generates a time-divisionally combined signal in one sequence obtained by combining these two sequences of signals. More specifically, for example, every time switching device 110 receives N pieces (N is an integer of 1 or more) of sampling data of the first signal sequence or the second signal sequence, switching device 110 switches, in accordance with a branch selection signal, a signal output to S/H circuit 101 at a stage subsequent to switching device 110. As a result, switching device 110 outputs a time-divisionally combined signal to S/H circuit 101 of ΔΣADC 100.

It should be noted that every time switching device 110 receives N pieces (N is an integer of 1 or more) of sampling data of the first signal sequence or the second signal sequence, switching device 110 switches the signal output to S/H circuit 101 at the stage subsequent to switching device 110. Therefore, switching speed fsw of switching device 110 is represented as fsw=fs/(2 N) using sampling rate fs of ΔΣADC 100.

S/H circuit 101 samples the time-divisionally combined signal and continues holding the sampled signal until S/H circuit 101 receives a subsequent input signal.

Operational amplifier 102 includes an inverting input terminal and a non-inverting input terminal. The signal output from S/H circuit 101 is input to the inverting input terminal, and operational amplifier 102 amplifies the signal. The non-inverting terminal of operational amplifier 102 is grounded.

Capacity 104-1 and capacity 104-2 are provided between the inverting input terminal and the output of operational amplifier 102. Capacity 104-1 and capacity 104-2 receive the output signal of operational amplifier 102 via switch 103-1 or switch 103-2. In this manner, the signals held in S/H circuit 101 are subjected to integration processing in an integration stage (processing section) formed by operational amplifier 102, capacity 104-1, and capacity 104-2. ΔΣADC 100 as shown in FIG. 1 has two capacities (i.e. capacity 104-1 and capacity 104-2) in order to integrate the signal held in S/H circuit 101. However, the number of capacities is not limited to two. When ΔΣADC 100 time-divisionally combines M signal sequences, ΔΣADC 100 may have M capacities.

Capacity 104-1 is controlled by switch 103-1. On the other hand, capacity 104-2 is controlled by switch 103-2. When the first sequence signal is selected by switching device 110, switch 103-1 is turned on and switch 103-2 is turned off. On the other hand, when the second sequence signal is selected by switching device 110, switch 103-1 is turned off and switch 103-2 is turned on. Switch 103-1 and switch 103-2 are controlled by a selection signal (hereinafter referred to as "branch selection signal"), which is input from outside, serving as a signal for selecting a signal sequence from among the first signal sequence and the second signal sequence. The branch selection signal is input to comparator 105, selection section 107, and separator 120, explained later. Therefore, using the branch selection signal, comparator 105, selection section 107, and separator 120 can determine which signal sequence is selected in switching device 110.

An integration result obtained from the integration processing performed by operational amplifier 102 and capacity 104-1 is referred to as a first integration result. On the other hand, an integration result obtained from the integration processing performed by operational amplifier 102 and capacity 104-2 is referred to as a second integration result. The first and second integration results are output from operational amplifier 102 to comparator 105. As described above, switch 103-1 and switch 103-2 are alternately turned on and off on every N samples, and therefore, comparator 105 receives the first integration result and the second integration result alternately on every N samples.

Comparator 105 compares the first integration result or the second integration result with a predetermined reference voltage, thereby converting the first integration result or the second integration result into a digital code having L values. In the explanation about the present embodiment, for example, comparator 105 is a one-bit comparator having two values (L=2). Even when L is three or more, and comparator 105 is a multi-bit comparator, the processings can be performed in the same manner as the case where L is 2, and these cases are also included in the present invention.

It should be noted that comparator 105 outputs, in accordance with the branch selection signal, a code value corresponding to the first signal sequence, chosen from among digitally converted one-bit code values, to first storage section 106-1. On the other hand, comparator 105 outputs, in accordance with the branch selection signal, a code value corresponding to the second signal sequence, chosen from among digitally converted one-bit code values, to second storage section 106-2.

First storage section 106-1 stores the code values corresponding to the first signal sequence that are output from comparator 105. Second storage section 106-2 stores the code values corresponding to the second signal sequence that are output from comparator 105. When the first signal sequence is selected, second storage section 106-2 continues holding the already stored code value until second storage section 106-2 receives a subsequent, new code value of the second signal sequence. In contrast, when the second signal sequence is selected, first storage section 106-1 continues holding the already stored code value until first storage section 106-1 receives a subsequent, new code value of the first signal sequence.

Selection section 107 selects a code value used for generating a feedback signal on the basis of the code value output from first storage section 106-1 or second storage section 106-2 in accordance with the branch selection signal. More specifically, when switching device 110 selects the first signal sequence, selection section 107 selects the code value stored in first storage section 106-1. On the other hand, when switching device 110 selects the second signal sequence, selection section 107 selects the code value stored in second storage section 106-2.

Selection section 107 outputs the selected code value to DAC 108.

DAC 108 converts the code value from digital to analog to generate a feedback signal.

S/H circuit 109 samples the feedback signal generated by DAC 108, and continues holding the sampled feedback signal until S/H circuit 109 receives a subsequent feedback signal.

In this manner, $\Delta\Sigma ADC$ 100 integrates the feedback signal and an input signal of a subsequent time step at a time using operational amplifier 102 and capacity 104-1 or capacity 104-2, thus performing the $\Delta\Sigma AD$ conversion. The feedback signal is a signal held in S/H circuit 109. The input signal of the subsequent time step is a signal held in S/H circuit 101.

The code value output from comparator 105 is output to separator 120.

Separator 120 separates, in accordance with the branch selection signal, the code value output from comparator 105 into two sequences, and outputs the separated signal to filter 130-1 and filter 130-2.

Filter 130-1 and filter 130-2 perform interpolation processing on the separated signals through filter operations. Filter 130-1 and filter 130-2 output interpolated signals.

Figure 2:
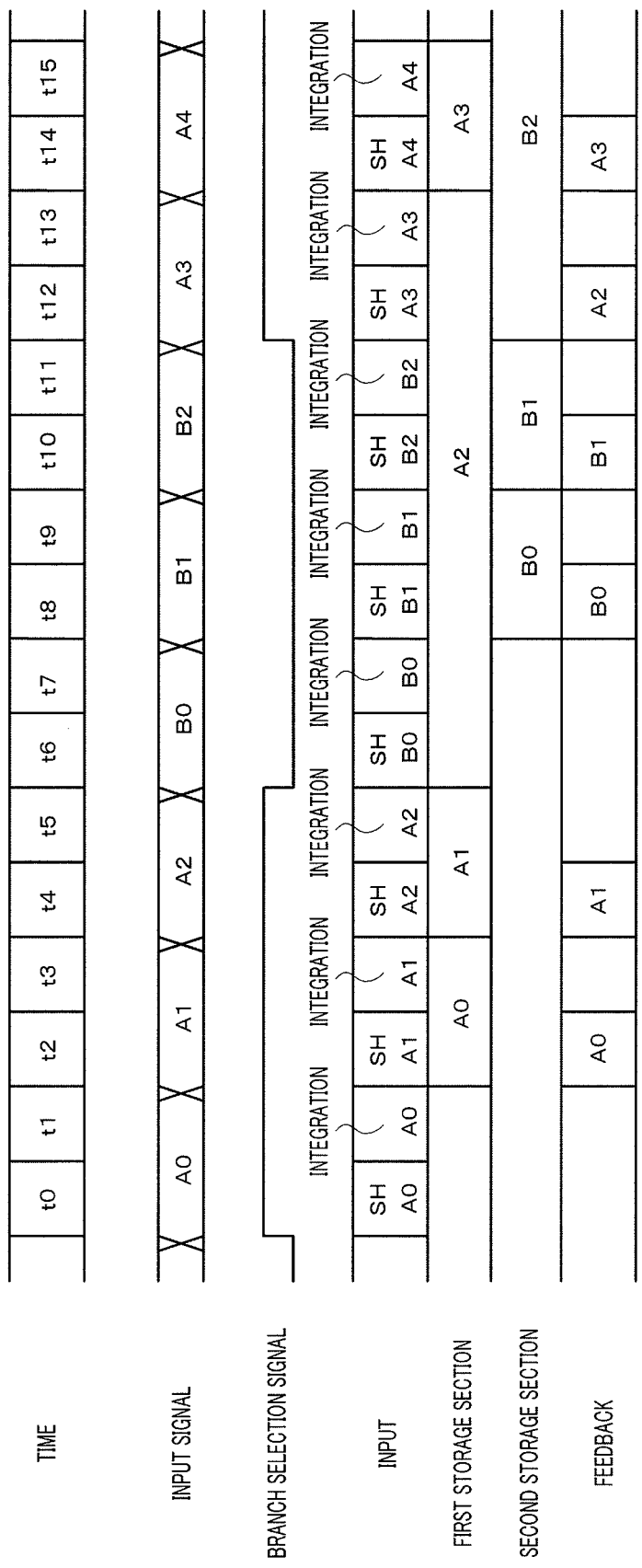
FIG. 2 is a time chart illustrating time-sequence processing performed by the ΔΣADC according to Embodiment 1.

Subsequently, time-sequence processing in $\Delta\Sigma ADC$ 100 having the configuration as described above will be explained. FIG. 2 is a time chart illustrating time-sequence processing performed by $\Delta\Sigma ADC$ 100. In FIG. 2, times t0, t1, . . . , t15 correspond to sampling times of $\Delta\Sigma ADC$ 100 (=1/fs).

At times t0 and t1, the first signal sequence given from first input terminal 111-1 is selected by switching device 110, and is output to S/H circuit 101. Hereinafter, the first signal sequence given at times t0 and t1 is referred to as A0 signal. At time t0, S/H circuit 101 samples the A0 signal, and S/H circuit 101 holds the sampled A0 signal until S/H circuit 101 receives a subsequent input.

At time t1, the A0 signal is integrated by the integration stage formed by operational amplifier 102 and capacity 104-1 or capacity 104-2. More specifically, switch 103-1 is turned on, and switch 103-2 is turned off, whereby only capacity 104-1 is connected to operational amplifier 102. Then, the A0 signal is integrated by operational amplifier 102 and capacity 104-1 (i.e. the integral capacity of the first signal sequence).

Afterward, in the integration processing of the first signal sequence, capacity 104-1 is connected to operational amplifier 102, and capacity 104-1 is used as the integral capacity for accumulating past signal information of the first signal sequence.

At time t2, the value integrated at time t1 (first integration result) is output to comparator 105. Then, the code value obtained by binarization performed by comparator 105 is input to first storage section 106-1. First storage section 106-1 stores this code value until first storage section 106-1 receives a subsequent code value of the first signal sequence.

Subsequently, selection section 107 selects the code value stored in first storage section 106-1, and DAC 108 generates an analog signal corresponding to the selected code value. Then, until the end of time t2, S/H circuit 109 samples the analog signal from DAC 108. Then, the sampled signal is held in S/H circuit 109 as the feedback signal.

Further, at times t2 and t3, the first signal sequence (i.e. the subsequent input signal) is sampled and held in S/H circuit 101. Hereinafter, the first signal sequence given at times t2 and t3 is referred to as A1 signal. By time t2, S/H circuit 101 samples to hold the A1 signal.

Subsequently, at time t3, the integration stage receives the A1 signal (i.e. the first signal sequence) held in S/H circuit 101 and the feedback signal of the A0 signal held in S/H circuit 109. The integration stage is formed by operational amplifier 102 and capacity 104-1 or capacity 104-2.

Since the signal integrated at time t3 is of the first signal sequence, operation is performed such that switch 103-1 is turned on and switch 103-2 is turned off on the basis of the branch selection signal, like the operation performed at time t1. Therefore, operation is performed such that only capacity 104-1 is connected to operational amplifier 102. Then, the A1 signal is integrated by operational amplifier 102 and capacity 104-1 (i.e. the integral capacity of the first signal sequence). At this occasion, capacity 104-1 integrates the first signal sequence from time t1 to time t3 continuously.

At times t4 and t5, the same processings as those performed at times t2 and t3 explained above are performed.

At times t6 and t7, the second signal sequence given from second input terminal 111-2 is selected by switching device 110, and is output to S/H circuit 101. Hereinafter, the second signal sequence given at times t6 and t7 is referred to as B0 signal. At time t6, S/H circuit 101 samples the B0 signal, and S/H circuit 101 holds the sampled B0 signal until S/H circuit 101 receives a subsequent input.

At time t7, the B0 signal is integrated by the integration stage formed by operational amplifier 102 and capacity 104-1 or capacity 104-2. More specifically, switch 103-1 is turned off, and switch 103-2 is turned on, whereby only capacity 104-2 is connected to operational amplifier 102. As a result, the B0 signal is integrated by operational amplifier 102 and capacity 104-2 (i.e. the integral capacity of the second signal sequence).

Afterward, in the integration processing of the second signal sequence, capacity 104-2 is connected to operational amplifier 102. Then, capacity 104-2 is used as the integral capacity for accumulating past signal information of the second signal sequence.

At time t8, the value integrated at time t7 (second integration result) is output to comparator 105. Then, the code value obtained by binarization performed by comparator 105 is input to second storage section 106-2. Second storage section 106-2 stores this code value until second storage section 106-2 receives a subsequent code value of the second signal sequence.

Subsequently, selection section 107 selects the code value stored in second storage section 106-2, and DAC 108 generates an analog signal corresponding to the selected code value. Then, until the end of time t8, S/H circuit 109 samples the analog signal from DAC 108, and the signal is held in S/H circuit 109 as the feedback signal.

Further, at times t8 and t9, the second signal sequence (i.e. the subsequent input signal) is sampled and held in S/H circuit 101. Hereinafter, the first signal sequence given at times t8 and t9 is referred to as B1 signal. By time t8, S/H circuit 101 samples to hold the B1 signal.

Subsequently, at time t9, the integration stage receives the B1 signal (i.e. the second signal sequence) held in S/H circuit 101 and the feedback signal of the B0 signal held in S/H circuit 109. The integration stage is formed by operational amplifier 102 and capacity 104-1 or capacity 104-2.

Since the signal integrated at time t9 is of the second signal sequence, operation is performed such that switch 103-1 is turned off and switch 103-2 is turned on the basis of the branch selection signal, like the operation performed at time t7. Therefore, operation is performed such that only capacity 104-2 is connected to operational amplifier 102. The B1 signal is integrated by operational amplifier 102 and capacity 104-2 (i.e. the integral capacity of the second signal sequence). At this occasion, capacity 104-2 integrates the second signal sequence from time t7 to time t9 continuously.

At times t10, t11, the same processings as those performed at times t8 and t9 explained above are performed.

At times t12, t13, the first signal sequence given from first input terminal 111-1 is selected by switching device 110 again, and is output to S/H circuit 101. Hereinafter, the first signal sequence given at times t12 and t13 is referred to as A3 signal. At time t12, S/H circuit 101 samples the A3 signal, and S/H circuit 101 holds the sampled A3 signal until S/H circuit 101 receives a subsequent input. Time t12 is different from time t0 in that, at time t12, first storage section 106-1 stores the code value for the A2 signal of the first signal sequence which is previous to the A3 signal. As a result, selection section 107 selects a code value for the A2 signal, DAC 108 generates an analog signal corresponding to the selected code value, and S/H circuit 109 samples the analog signal. Further, the signal is held as the feedback signal.

First storage section 106-1 continues to store the output of comparator 105 of only the first signal sequence until first storage section 106-1 receives a subsequent code value of the first signal sequence. On the other hand, second storage section 106-2 continues to store the output of comparator 105 of only the second signal sequence until second storage section 106-2 receives a subsequent code value of the second signal sequence.

Subsequently, at time t13, the integration stage receives the A3 signal (i.e. the first signal sequence) held in S/H circuit 101 and the feedback signal of the A2 signal held in S/H circuit 109. The integration stage is formed by operational amplifier 102 and capacity 104-1 or capacity 104-2.

Since the signal integrated at time t13 is of the first signal sequence, operation is performed such that switch 103-1 is turned on and switch 103-2 is turned off, like the operation performed at time t1. Therefore, operation is performed such that only capacity 104-1 is connected to operational amplifier 102. The A3 signal is integrated by operational amplifier 102 and capacity 104-1 (i.e. the integral capacity of the first signal sequence).

As described above, $\Delta\Sigma$ADC 100 according to the present embodiment is a discrete time $\Delta\Sigma$ADC for DS conversion with sampling rate fs. S/H circuit 101 samples and holds the input signals that are time-divisionally switched and input from among M signal sequences (M is an integer of 2 or more) at switching speed fsw. Switch 103-1 and switch 103-2 controls selection of one of the two capacities (i.e. capacity 104-1 and capacity 104-2) to use as the integral capacity. Comparator 105 encodes, into the code value, the integration result provided by the integration processing section formed by operational amplifier 102 and the capacity chosen by switch 103-1 or switch 103-2. First storage section 106-1 and second storage section 106-2 store the code values for the respective signal sequences. Selection section 107 selects one of two code values stored for the respective signal sequences. DAC 108 converts the selected code value from digital to analog and generates a feedback signal. S/H circuit 109 samples and holds the feedback signal. Operational amplifier 102 integrates the sampled/held input signal and the sampled/held feedback signal.

In this manner, for the code values provided by comparator 105, $\Delta\Sigma$ADC 100 has first storage section 106-1 and second storage section 106-2 respectively for the signal sequences (the first signal sequence and the second signal sequence) constituting the time-divisionally combined signal. Then, one of the two storage sections (i.e. first storage section 106-1 and second storage section 106-2) that corresponds to the branch selection signal is configured to store the code value obtained from comparator 105. On the other hand, one of the two storage sections (i.e. first storage section 106-1 and second storage section 106-2) that is not the storage section corresponding to the branch selection signal is configured to hold the already stored code value. For example, when selection section 107 receives the first signal sequence, selection section 107 selects the code value corresponding to the first signal sequence, and outputs the code value to DAC 108 on an as is basis. On the other hand, when selection section 107 does not receive the first signal sequence, first storage section 106-1 continues holding the already stored code value until selection section 107 receives a subsequent code value corresponding to the first signal sequence.

Therefore, even when switching speed fsw of switching device 110 is lower than sampling rate fs of $\Delta\Sigma$ADC 100, the time-divisionally combined signal generated by switching device 110 can be converted by the time-division $\Delta\Sigma$AD conversion. In this manner, in $\Delta\Sigma$ADC 100 according to the present embodiment, the $\Delta\Sigma$AD conversion processing of the time-divisionally multiplexed signal obtained by time-divisionally combining the plurality of signal sequences can be achieved with only one $\Delta\Sigma$ADC 100, and this configuration greatly reduces the circuit scale. On the other hand, when a plurality of $\Delta\Sigma$ADCs are used for a plurality of signal sequences, a plurality of output terminals are required to output a plurality of digital signals. In contrast, $\Delta\Sigma$ADC 100 outputs only one sequence of code values as the digital codes, and this configuration reduces the number of output terminals.

In addition, $\Delta\Sigma$ADC 100 according to the present embodiment can suppress deterioration of the noise shaping characteristic even when switching speed fsw of switching device 110 for time-division process decreases and the actual sampling rate decreases. This point will be hereinafter explained using a simulation result of quantization noise.

Figure 3A:
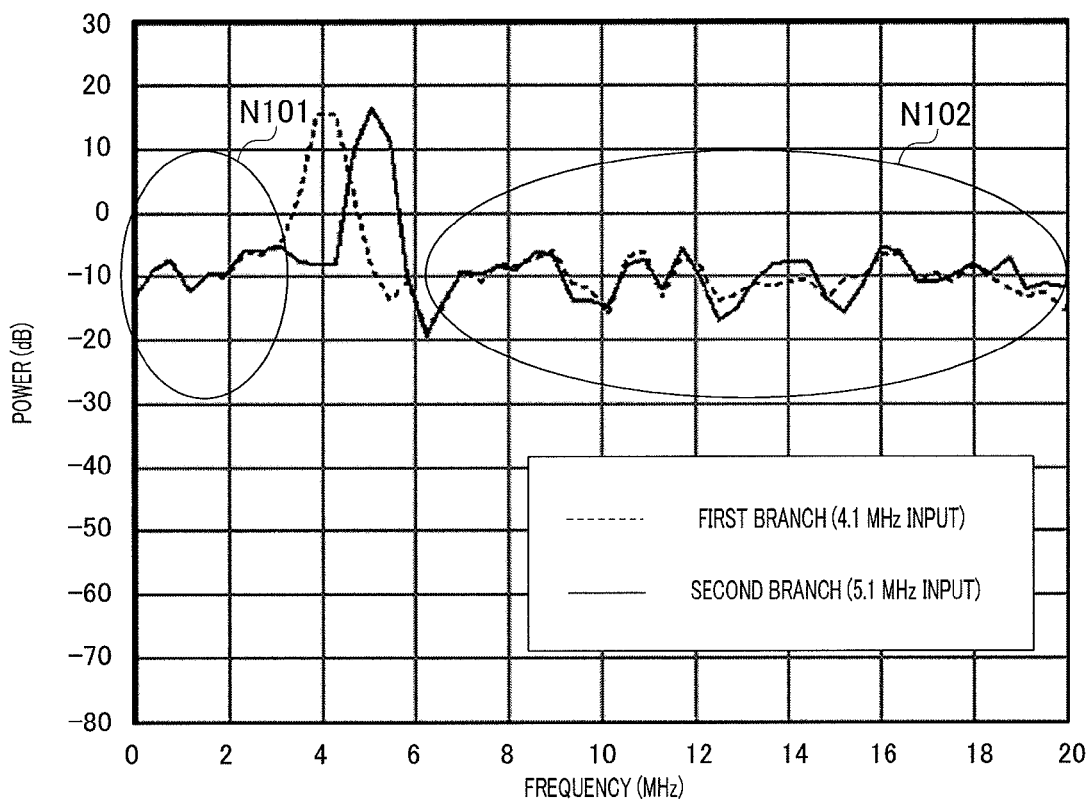
FIG. 3 is a figure illustrating noise shaping characteristic.
Figure 3B:
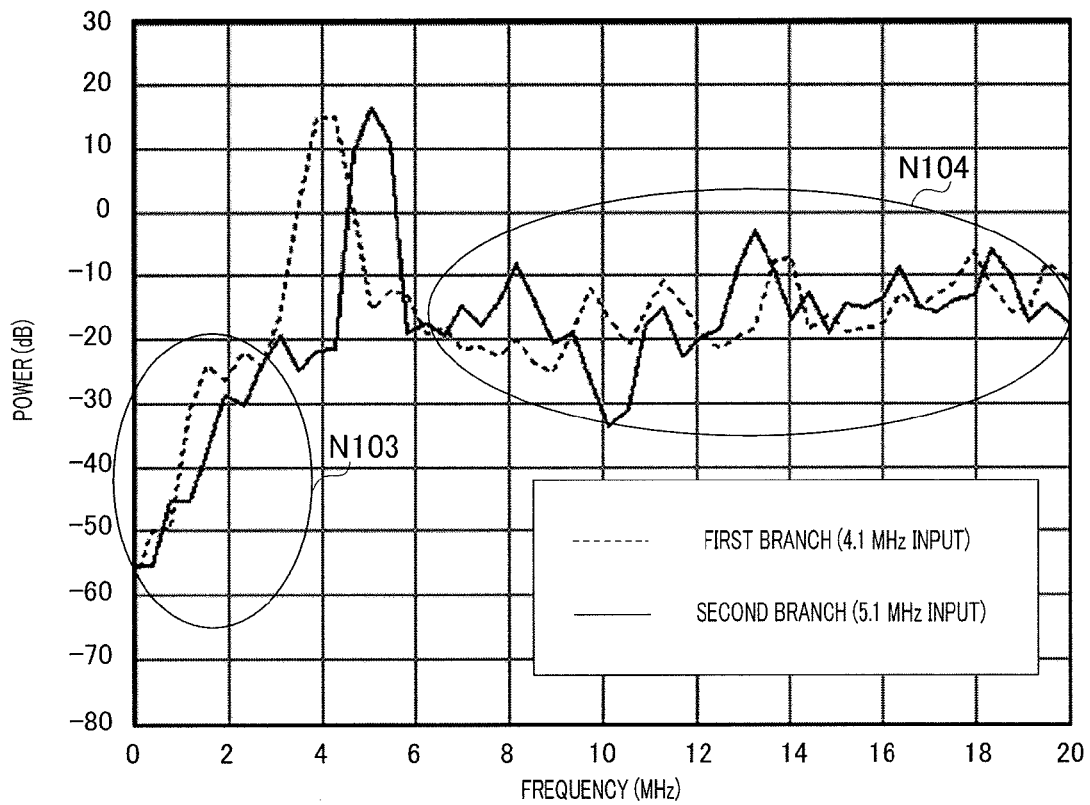

FIG. 3A is a figure illustrating a simulation result of quantization noise in a conventional time-division $\Delta\Sigma$ADC. FIG. 3B illustrates a simulation result of quantization noise in $\Delta\Sigma$ADC 100 according to the present embodiment. In FIGS. 3A and 3B, the horizontal axis represents a frequency (MHz), and the vertical axis represents powers (magnitude-squared [dB]) of the first signal sequence and the second signal sequence. FIGS. 3A and 3B show a simulation result when the conventional time-division $\Delta\Sigma$ADC and $\Delta\Sigma$ADC 100 according to the present embodiment perform time-division $\Delta\Sigma$ modulation on the first signal sequence of 4.1 MHz and a second signal sequence of 5.1 MHz. This indicates that, even when sampling rate fs is low, the noise shaping function of $\Delta\Sigma$ADC 100 according to the present embodiment is not lost. Therefore, sampling rate fs is set at 100 MHz in the simulation. On the other hand, switching speed fsw of switching device 110 for time-division process is set at 100 MHz.

As can be seen from FIG. 3A, the conventional time-division $\Delta\Sigma$ADC has a small difference between a quantization noise N101 near DC and a quantization noise N102 in high frequency, and the quantization noise is substantially uniformly distributed in the frequency axis. In this manner, the conventional time-division $\Delta\Sigma$ADC generates the quantization noise substantially uniformly throughout the entire region from near DC to high frequency. This indicates that, when sampling rate fs is low, signals are mixed between two sequences in the conventional time-division ΔΣADC, which causes abnormal operation and failure of normal ΔΣADC conversion process. As a result, in the conventional time-division ΔΣADC, the noise shaping function (i.e. an effect peculiar to the ΔΣADC) does not work, and the quantization noise is generated substantially uniformly throughout the entire region from near DC to high frequency.

In contrast, as can be seen from FIG. 3B, in ΔΣADC 100 according to the present embodiment, the quantization noise N103 near DC is less than the quantization noise N104 in high frequency, and it is understood that the quantization noise near DC has moved to high frequency. In this manner, it is understood that, even when sampling rate fs is low, ΔΣADC 100 according to the present embodiment suppresses the quantization noise near DC, and the noise shaping function is working. This indicates that, even when sampling rate fs is low, ΔΣADC 100 according to the present embodiment can avoid mixing of signals between two sequences. As a result, ΔΣADC 100 according to the present embodiment can perform the time-division ΔΣAD conversion without losing the noise shaping function.

(Embodiment 2)

In Embodiment 1, the discrete time ΔΣADC having the S/H circuit has been explained. In the present embodiment, a continuous time ΔΣADC will be explained.

Figure 4:
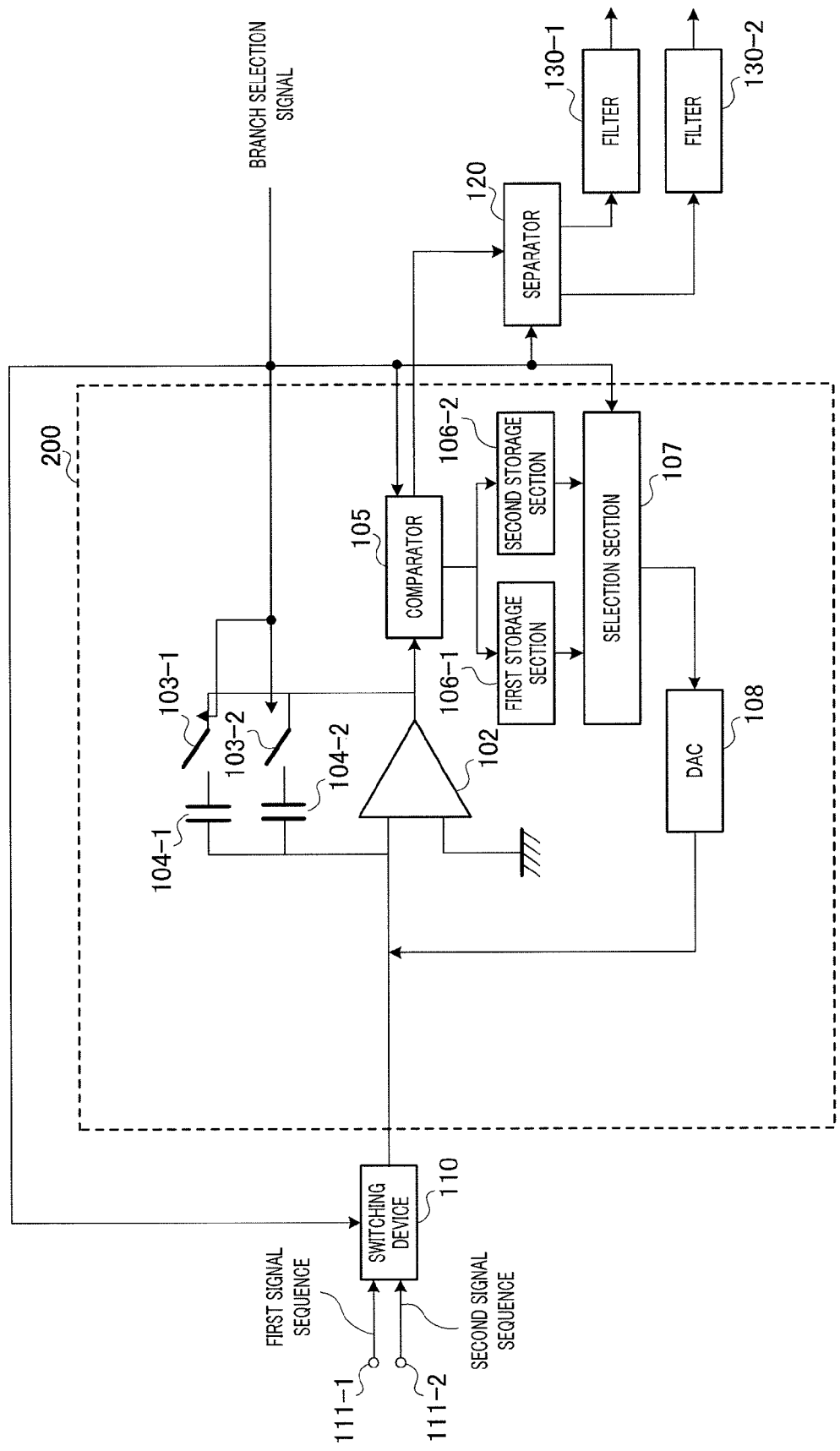
FIG. 4 is a block diagram illustrating an essential configuration of a ΔΣADC according to Embodiment 2 of the present invention.

FIG. 4 is a block diagram illustrating an essential configuration of a ΔΣADC according to the present embodiment. ΔΣADC 200 as shown in FIG. 4 is a continuous time ΔΣADC. In ΔΣADC 200 according to the present embodiment of FIG. 4, constituent portions common to those of ΔΣADC 100 of FIG. 1 are denoted with the same reference numerals as those of FIG. 1, and description thereabout is omitted. ΔΣADC 200 of FIG. 4 has a configuration in which S/H circuits 101 and 109 are removed from the configuration of ΔΣADC 100 of FIG. 1.

In other words, in the present embodiment, output signals from switching device 110 and DAC 108 are directly input to an integration stage formed by operational amplifier 102 and capacity 104-1 or capacity 104-2.

Figure 5:
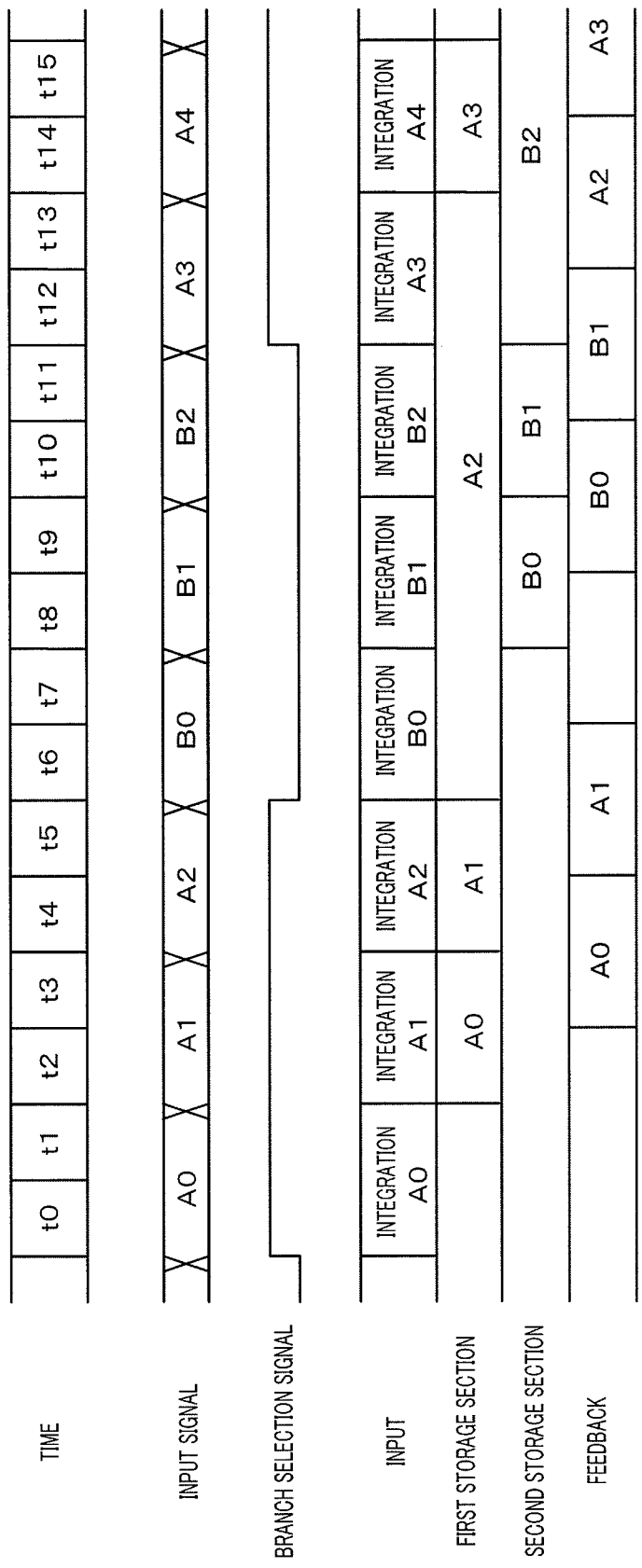
FIG. 5 is a time chart illustrating time-sequence processing performed by the ΔΣADC according to Embodiment 2.

Subsequently, time-sequence processing in ΔΣADC 200 having the configuration as described above will be explained. FIG. 5 is a time chart illustrating time-sequence processing performed by ΔΣADC 200. In FIG. 5, times t0, t1, . . . , t15 correspond to sampling times of ΔΣADC 100.

An A0 signal of the first signal sequence input from first input terminal 111-1 is selected by switching device 110, and is input to the integration stage formed by operational amplifier 102 and capacity 104-1 or capacity 104-2. In Embodiment 1, a signal sampled at a certain time is held on an as is basis, and the held signal is input to the integration stage. In contrast, in Embodiment 2, all the continuous signal at times t1 and t2 is input to the integration stage and is integrated.

At times t1 and t2, the first signal sequence is integrated, and accordingly, switch 103-1 is turned on, and switch 103-2 is turned off, whereby only capacity 104-1 is connected to operational amplifier 102. Then, until the end of time t1, the A0 signal is integrated. At time t2, the first integration result obtained from the integration processing is input to comparator 105. Afterward, a code value output from comparator 105 is stored to first storage section 106-1, and selection section 107 selects a code value of first storage section 106-1. By the end of time t2, the code value is input to DAC 108.

At time t3, DAC 108 outputs an analog signal, and the signal is maintained until a subsequent code value is input.

Then, at times t2 and t3, a subsequent A1 signal is input to the integration stage formed by operational amplifier 102 and capacity 104-1 or capacity 104-2. This integration stage integrates two signals (i.e. the A1 signal input at times t2 and t3 and the feedback signal of the A0 signal output from DAC 108 at time t2). Afterward, at times t4 to t15, the same processings as those of Embodiment 1 are performed.

As described above, ΔΣADC 200 according to the present embodiment is a continuous time ΔΣADC for DS conversion with sampling rate fs. Operational amplifier 102 integrates the feedback signal and the input signal that is time-divisionally switched and input from among M signal sequences (M is an integer of 2 or more) at switching speed fsw. Switch 103-1 and switch 103-2 controls selection of one of the two capacities (i.e. capacity 104-1 and capacity 104-2) to use as the integral capacity. The integration processing section is formed by operational amplifier 102 and the capacity chosen by switch 103-1 or switch 103-2. Comparator 105 encodes the integration result provided by the integration processing section into the code value. First storage section 106-1 and second storage section 106-2 store the code values for the respective signal sequences. Selection section 107 selects one of two code values stored for the respective signal sequences. DAC 108 converts the selected code value from digital to analog and generates a feedback signal.

For the code values provided by comparator 105, ΔΣADC 200 has first storage section 106-1 and second storage section 106-2 respectively for the signal sequences (the first signal sequence and the second signal sequence) constituting the time-divisionally combined signal. Then, one of the two storage sections (i.e. first storage section 106-1 and second storage section 106-2) that corresponds to the branch selection signal is configured to store the code value obtained from comparator 105. One of the two storage sections (i.e. first storage section 106-1 and second storage section 106-2) that is not the storage section corresponding to the branch selection signal is configured to hold the already stored code value. For example, when selection section 107 receives the first signal sequence, selection section 107 selects the code value corresponding to the first signal sequence, and outputs the code value to DAC 108 on an as is basis. On the other hand, when selection section 107 does not receive the first signal sequence, first storage section 106-1 continues holding the already stored code value until selection section 107 receives a subsequent code value corresponding to the first signal sequence.

Therefore, even when switching speed fsw of switching device 110 is lower than sampling rate fs of ΔΣADC 200, ΔΣADC 200 can perform the time-division ΔΣAD conversion on the time-divisionally combined signal. In this manner, in the present embodiment, the ΔΣAD conversion processing of the time-divisionally multiplexed signal obtained by time-divisionally combining the plurality of signal sequences can be achieved with only one ΔΣADC 200, and this configuration greatly reduces the circuit scale. On the other hand, when a plurality of ΔΣADCs are used for a plurality of signal sequences, a plurality of output terminals are required to output a plurality of digital signals. In contrast, ΔΣADC 200 outputs only one sequence of code values as the digital codes, and this configuration reduces the number of output terminals.

In the above explanation, a system has been explained as an example, in which the signal sequences are switched every three (N=3) samples. However, the present invention is not limited thereto. In general, with the present invention, the time-division ΔΣADC conversion can be performed in a system in which signal sequences are switched on every N (N is a natural number including 1) samples. More specifically, the present invention can be applied to a system in which switching speed fsw of switching device 110 and sampling rate fs of ΔΣADC 100 satisfy the relationship of fsw≦fs/2.

In the above explanation, the one-bit ΔΣADC has been explained. However, the present invention can also be applied to a multi-bit ΔΣADC. In the above explanation, the ΔΣADC of the first degree has been explained. However, the present invention can also be applied to a ΔΣADC of a higher degree. A ΔΣADC of a higher degree has a plurality of integration stages (processing sections) formed by operational amplifiers and capacities, and perform ΔΣAD conversions of a plurality of degrees using feedback signals corresponding to a plurality of integration results of the plurality of integration stages.

Further, the number of time-divisionally multiplexed signal sequences (the number of multiplexed sequences) is not limited to two sequences. The same processings can also be achieved with a signal obtained by multiplexing three or more signal sequences. When the branch selection signal is fixed, a conventional ΔΣAD conversion for one sequence can be realized with the above ΔΣADC.

The disclosure of Japanese Patent Application No. 2010-010109, filed on Jan. 20, 2010, including the specification, drawings and abstract, is incorporated herein by reference in its entirety.

Industrial Applicability

The ΔΣADC according to the present invention is effective as a ΔΣADC in a time-division MIMO, a time-division MRC, and a time-division diversity. When an I signal and a Q signal are time-divided in a generally-available wireless system, the ΔΣADC according to the present invention is not limited to a communication system, and the ΔΣADC according to the present invention is effective for other systems for performing time-division ΔΣAD conversion on a plurality of signals.

REFERENCE SIGNS LIST

100, 200 ΔΣADC
101, 109 S/H circuit
102 Operational amplifier
104-1, 104-2 Capacity
103-1, 103-2 Switch
105 Comparator
106-1 First storage section
106-2 Second storage section
107 Selection section
108 DAC
110 Switching device
111-1 First input terminal
111-2 Second input terminal
120 Separator
130-1, 130-2 Filter

The invention claimed is:

1. A delta sigma analog-to-digital converter for performing delta sigma analog-to-digital conversion, comprising:
an operational amplifier that integrates a feedback signal and a time-divisionally combined signal that is obtained by time-divisionally combining M signal sequences (M is an integer of 2 or more);
M integral capacities;
a switch that controls selection of an integral capacity for use, from among the M integral capacities in accordance with a selection signal;
a comparing section that encodes and converts, into a code value, an integration result provided by an integration processing section formed by the operational amplifier and the integral capacity selected by the switch;
a storage section that stores respective M code values for the M signal sequences;
a selection section that selects one of the M code values stored for the M signal sequences, in accordance with the selection signal; and
a digital-to-analog converter that converts, from digital to analog, the selected code value and generates the feedback signal, wherein:
the comparing section encodes and converts the integration result at a first rate;
a specific one of the M signal sequences is time-divisionally combined at a second rate in the time-divisionally combined signal;
the switch selects a specific one of the M integral capacities for use at the second rate; and
the second rate is lower than the first rate/M.

2. The delta sigma analog-to-digital converter according to claim 1, further comprising:
a first sample hold circuit that samples and holds the time-divisionally combined signal; and
a second sample hold circuit that samples and holds the feedback signal, wherein the operational amplifier integrates the time-divisionally combined signal and feedback signal sampled and held.

3. The delta sigma analog-to-digital converter according to claim 1, wherein:
the storage section includes the M storage sections;
the code value is stored in a storage section chosen from among the M storage sections in accordance with the selection signal; and
the already stored code value is held in a storage section other than the storage section chosen from among the M storage sections in accordance with the selection signal.

4. The delta sigma analog-to-digital converter according to claim 3,
wherein the selection section selects one of the M storage sections in accordance with the selection signal, and outputs, to the digital-to-analog converter, the code value stored in the selected storage section.

5. The delta sigma analog-to-digital converter according to claim 1,
wherein the comparing section compares the integration result with 2^L (L is an integer of 0 or more) reference levels to convert the integration result into the code value having L bits.

6. The delta sigma analog-to-digital converter according to claim 1, further comprising:
a plurality of the integration processing sections, wherein delta sigma analog-to-digital conversions of a plurality of degrees are performed using feedback signals corresponding to a plurality of integration results provided by the plurality of integration processing sections.

7. The delta sigma analog-to-digital converter according to claim 1,
wherein the second rate is lower than or equal to ½×(the first rate/M).

8. The delta sigma analog-to-digital converter according to claim 1, further comprising:
a switching section that time-divisionally combines each of the M signal sequences at the second rate to generate the time-divisionally combined signal.

* * * * *